(12) United States Patent
Nobunaga et al.

(10) Patent No.: US 8,295,098 B2
(45) Date of Patent: Oct. 23, 2012

(54) LOCAL SENSING IN A MEMORY DEVICE

(75) Inventors: Dean Nobunaga, Cupertino, CA (US);
William Kammerer, Los Altos, CA (US); Uday Chandrasekhar, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 261 days.

(21) Appl. No.: 12/816,662

(22) Filed: Jun. 16, 2010

(65) Prior Publication Data

US 2011/0310675 A1   Dec. 22, 2011

(51) Int. Cl.
*G11C 11/34* (2006.01)

(52) U.S. Cl. ............... 365/185.25; 365/185.18; 365/205

(58) Field of Classification Search ............. 365/185.25, 365/185.18, 205
See application file for complete search history.

(56) References Cited

U.S. PATENT DOCUMENTS

| | | | |
|---|---|---|---|
| 8,179,711 B2* | 5/2012 | Kim et al. ..................... 365/148 |
| 2004/0169529 A1* | 9/2004 | Afghahi et al. .................. 327/51 |
| 2006/0083071 A1* | 4/2006 | Nagashima .............. 365/185.28 |
| 2010/0195399 A1* | 8/2010 | Tanaka ..................... 365/185.18 |
| 2011/0063919 A1 | 3/2011 | Chandrasekhar et al. |
| 2011/0107014 A1 | 5/2011 | Ruby et al. |

* cited by examiner

*Primary Examiner* — Fernando Hidalgo
(74) *Attorney, Agent, or Firm* — Leffert Jay & Polglaze, P.A.

(57) ABSTRACT

Methods for sensing, memory devices, and memory systems are disclosed. In one such memory device, a local sense circuit provides sensing of an upper group of memory cells while a global sense circuit provides sensing of a lower group of memory cells. Data sensed by the local sense circuit is transferred to the global sense circuit over local data lines or a global transfer line that is multiplexed to the local data lines. An alternate embodiment uses the local sense circuit to sense both upper and lower groups of memory cells.

26 Claims, 8 Drawing Sheets

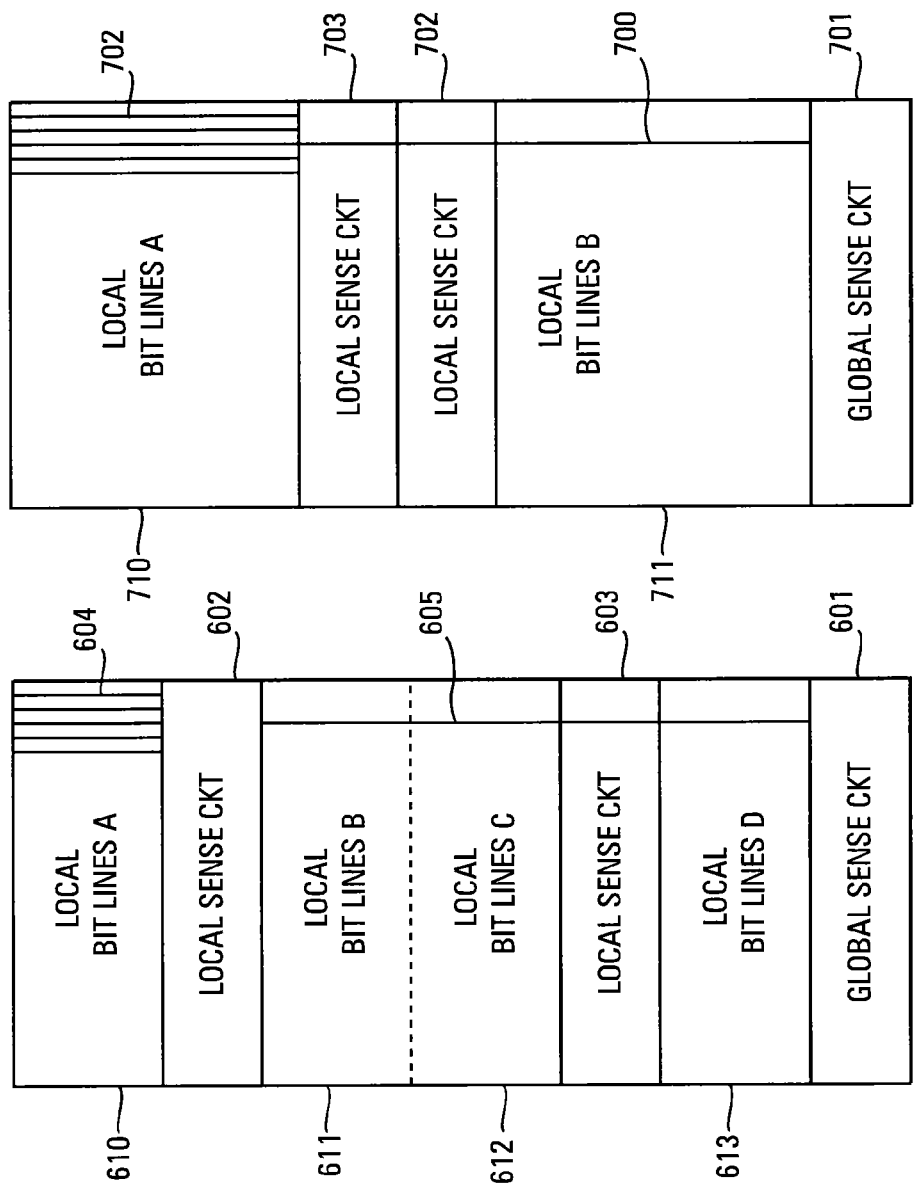

LOCAL SENSING IN A MEMORY DEVICE

TECHNICAL FIELD

The present embodiments relate generally to memory and a particular embodiment relates to sense circuitry in a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A flash memory device is a type of memory in which the cells are typically grouped into blocks that can be erased and reprogrammed in blocks instead of one byte at a time. Changes in threshold voltage of the memory cells, through erasing or programming of charge storage structures (e.g., floating gates or charge traps) or other physical phenomena (e.g., phase change or polarization), determine the data value of each cell. The data in a cell of this type is determined by the presence or absence of the charge in the charge storage structure.

Detecting the presence or absence of the charge can be accomplished by a sense (e.g., read or program verify) operation. The sense operation is performed by a sense circuit coupled to the data lines (e.g., bit lines) of a memory array. A typical prior art sense circuit is illustrated in the memory device of FIG. 1.

The memory device comprises a memory array portion 101, a multiplexing circuit 115, and a sense circuit 100 with dynamic data cache circuitry. Since a typical sense operation is performed on alternate bit lines (e.g., even or odd bit lines), a multiplexing circuit 115 selects between the even and odd bit lines of the memory array 101. The multiplexing circuit 115 selects which bit line is enabled to the sense circuit 100.

A typical prior art sense operation of single level cells (SLC) comprises grounding the source line of the memory block to be sensed, precharging the memory block data lines (e.g., bit lines), and biasing the access lines (e.g., word lines) in order to turn on all of the word lines except the word line to be sensed. A sensed voltage is applied to the word line to be sensed and the select gates of alternate bit lines are turned on. If the bit line becomes discharged, the threshold voltage of the cell being read is less than the word line voltage. In this case, the cell is erased and is in a logical 1 state. If the bit line remains precharged, the threshold voltage of the cell being read is greater than the word line voltage that was applied to the word line being sensed. In this case, the memory cell is programmed and is in a logical 0 state. Multiple level memory cells (MLC) can be sensed in substantially the same way except multiple sense operations might be needed to sense the multiple levels.

In order to increase the amount of data stored in an integrated circuit, memory manufacturers can increase the memory density of the memory devices. One way of accomplishing this is to increase the number of memory cells on each memory device. A greater number of memory cells results in longer bit lines to connect to each of the series strings. This results in a larger resistance/capacitance (RC) for the longer bit lines.

RC is one of many elements that can affect memory device performance. The larger the RC of the bit lines the slower the memory operations since more time is needed to charge/discharge the bit lines during sense operations.

For the reasons stated above, and for other reasons stated below that will become apparent to those skilled in the art upon reading and understanding the present specification, there is a need in the art for a memory array architecture that better manages increasing bit line resistance and/or capacitance.

BRIEF DESCRIPTION OF THE DRAWINGS

FIG. 6 shows a block diagram of an alternate embodiment of a memory array having multiple local sense circuits.

FIG. 7 shows a block diagram of another alternate embodiment of a memory array having multiple local sense circuits.

DETAILED DESCRIPTION

Figure 1:
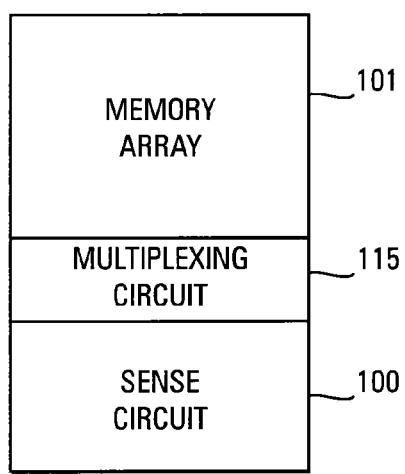
FIG. 1 shows a typical prior art memory array coupled to sense circuitry.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
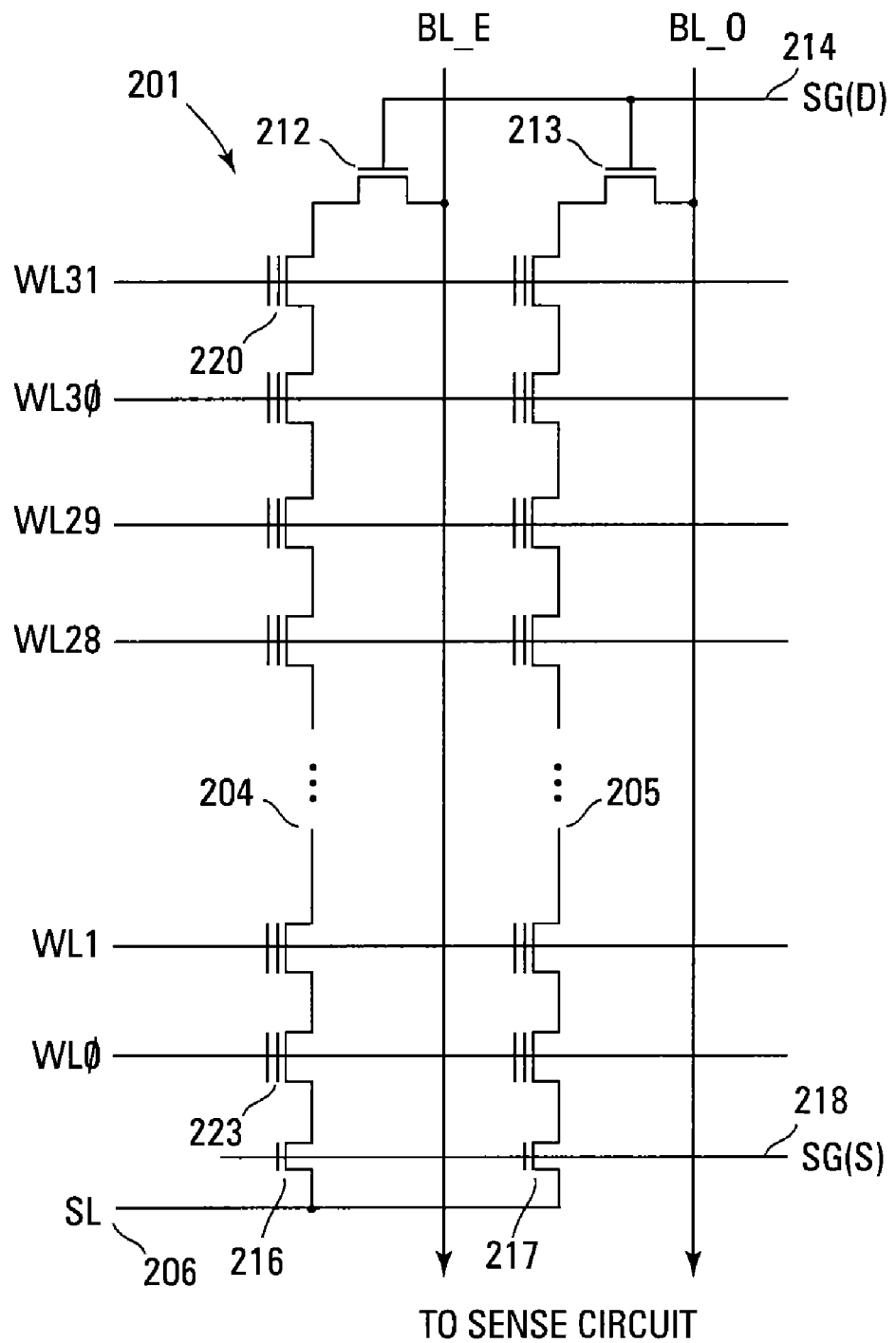
FIG. 2 shows a schematic diagram of one embodiment of a portion of a memory array.

FIG. 2 illustrates a schematic diagram of one embodiment of a portion of a NAND architecture memory array 201, as illustrated in subsequent sense circuit embodiments, comprising series strings of non-volatile memory cells that can be read using the embodiments of the local sense circuits (e.g., local sense amplifiers). The present embodiments are not limited to the illustrated NAND architecture. Alternate embodiments can use NOR or other architectures as well.

The array comprises an array of non-volatile memory cells 201 (e.g., floating gate) arranged in columns such as series strings 204, 205. Each of the cells 201 are coupled drain to source in each series string 204, 205. An access line (e.g. word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the series strings and eventually coupled to sense circuitry, as described subsequently, that detect the state of each cell by sensing current or voltage on a selected bit line.

Each series string 204, 205 of memory cells is coupled to a source line 206 by a source select gate 216, 217 and to an individual bit line BL_E, BL_O by a drain select gate 212, 213. The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or a multiple level cell (MLC). Each cell's threshold voltage ($V_t$) is indicative of the data that is stored in the cell. For example, in an SLC, a $V_t$ of 1.5V might indicate a programmed cell while a $V_t$ of −0.5V might indicate an erased cell. The MLC uses multiple $V_t$ ranges that each indicates a different state. Multilevel cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

Figure 3:
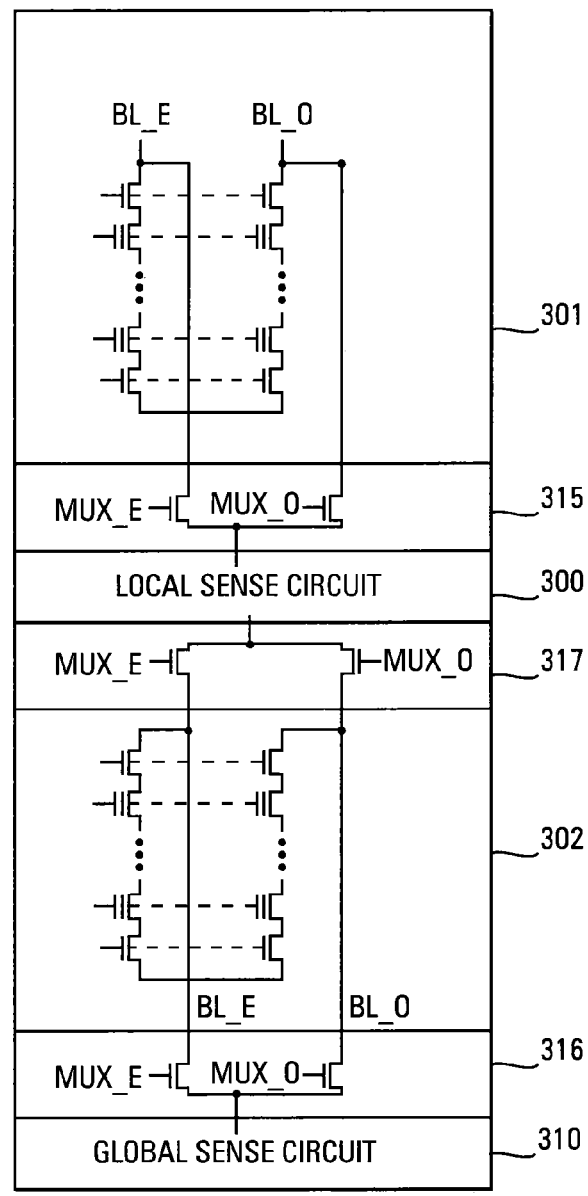
FIG. 3 shows a block diagram of one embodiment of a memory array having a local sense circuit.

FIG. 3 illustrates a block diagram of one embodiment of a memory array having a local sense circuit architecture. This embodiment uses a local sense circuit 300, in addition to the global (e.g., bottom) sense circuit 310, to reduce the length of the bit lines of the memory array. Thus, the resistance/capacitance of the bit lines can be reduced by this architecture. In one embodiment, the local sense circuit 300 approximately bisects the bit lines so that the upper memory 301 has substantially the same quantity of memory cells as the lower memory 302.

The embodiment of FIG. 3 comprises two groups (e.g., memory blocks) of memory cells 301, 302 that are coupled to the local sense circuit 300 through multiplexing circuits 315, 317. One embodiment of the groups of memory cells is illustrated in FIG. 2.

The multiplexing circuits 315-317 are configured to select between the odd and even bit lines during a sense operation. Since a sense circuit typically senses alternate bit lines during a sense operation, either the odd bit lines or the even bit lines are selected at any one time for sensing. The multiplexing circuits 315-317 can be any circuit that enables such switching to occur. For example, a transistor coupled between each respective bit line and the sense circuit is one such multiplexing circuit.

Figure 4:
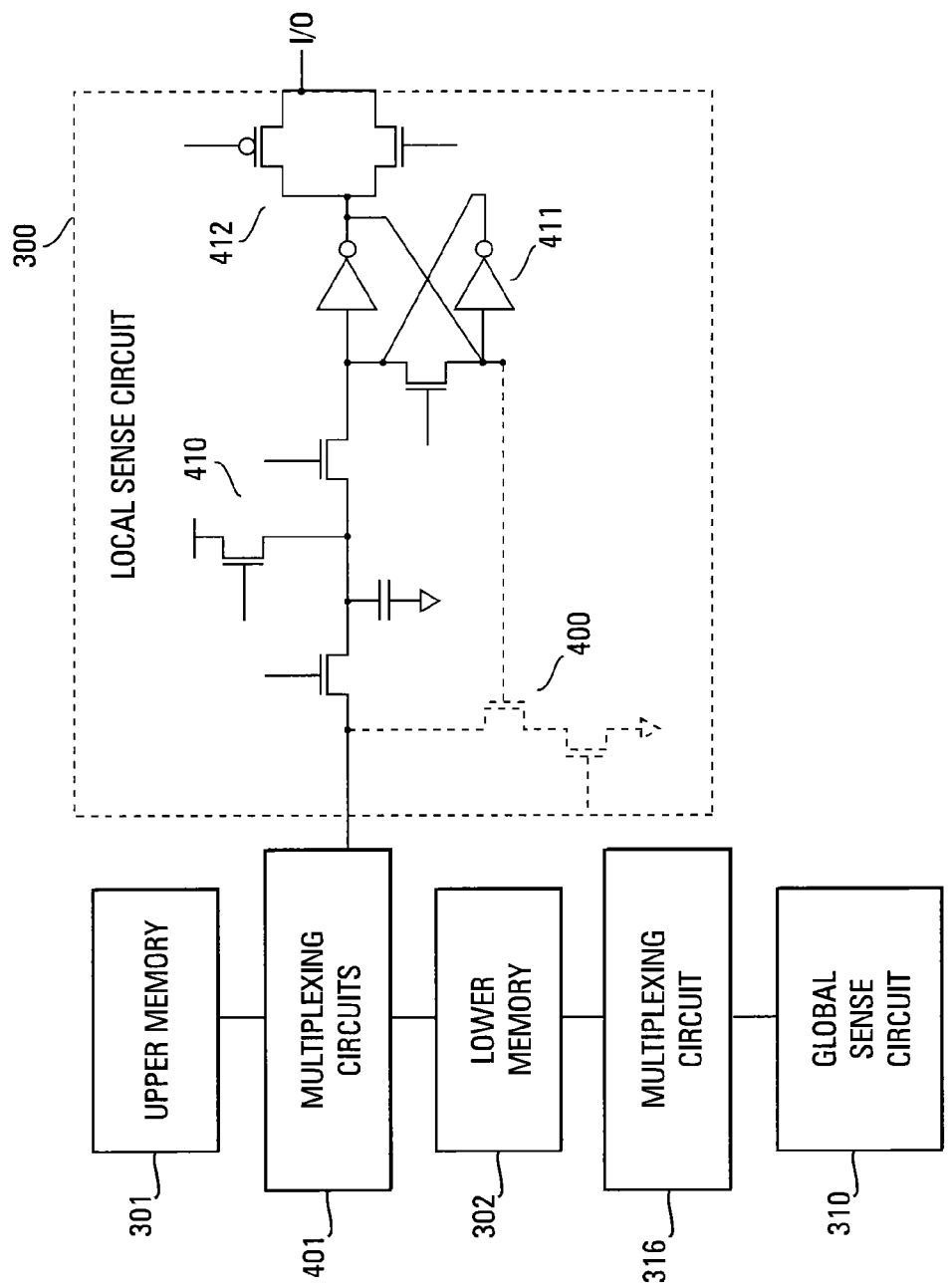
FIG. 4 shows a schematic diagram of one embodiment of a local sense circuit in accordance with the block diagram of FIG. 3.

The local sense circuit 300 performs only a sense function and precharge function without the data cache function. One example of such a local sense circuit is illustrated in FIG. 4. The local sense circuit 300 divides the bit lines into shorter segments and is responsible, in this embodiment, for sensing only the bit lines of the upper group of memory cells.

The locally sensed bit line data from the upper memory group 301 is transferred to the global sense circuit 310 (e.g., global sense amplifier) over the bit lines. The multiplexing circuit 317 between the local sense circuit 300 and the bit lines of the lower group of memory cells 302 controls the transfer of the data from the local sense circuit 300 and the global sense circuit 310.

In one embodiment, the upper memory sensed data is transferred to the lower, global sense circuit 310 during the next cycle of a read/verify operation of the upper group of memory cells 302. During this time, the lower group of bit lines 302 is not being used during sense of upper group of memory cells and can be utilized to transfer data to cache circuitry in the global sense circuit 310 as discussed subsequently.

The global sense circuit 310, in the illustrated embodiment, is a bottom sense circuit that includes additional functions beyond the sense function of the local sense circuit 300. The bottom sense circuit 310 performs a sense function of the lower group of memory cells in addition to various data cache and bit line pre-charging functions as illustrated subsequently in the embodiment of FIG. 5. In one embodiment, the bottom bit lines can be precharged while the upper bit lines are being sensed by the local sense circuit 300. This can reduce the time necessary to perform both a data sense of the upper memory cells and a transfer of the data from the local sense circuit 300 to the global sense circuit 310.

In one embodiment, the global sense circuit 310 can disable the upper multiplexing circuit 315 during a sensing operation of the lower bit lines. This can isolate the lower bit lines from the upper bit lines, thus reducing the bit line resistance/capacitance during the sense operation.

FIG. 4 illustrates a schematic diagram of one embodiment of a local sense circuit 300 in accordance with the block diagram of FIG. 3. The local sense circuit 300 components are for purposes of illustration only since alternate embodiments can implement a sense function using different circuits.

The local sense circuit 300 is shown coupled to a multiplexing circuits block 401, including both multiplexing circuits 315, 317 of FIG. 3, that couples the local sense circuit 300 to both the upper memory group 301 and the lower memory group 302. The global sense circuit 310 is also shown coupled to the lower memory group 302 through the lower multiplexing circuit 316.

The local sense circuit 300 comprises transistors 410 that provide precharge and voltage clamping functions. A latch 411 latches the data sensed on the bit line. An output circuit 412 equally drives both logically low and logically high data.

The local sense circuit 300 of FIG. 4 also illustrates an alternate embodiment of local sensing in which both the upper memory group 301 and the lower memory group 302 are sensed by the local sense circuit 300 instead of the global sense circuit 310 sensing the lower memory group 302. The alternate embodiment sense circuit is substantially the same as that illustrated in FIG. 4 but also includes the dotted transistor circuit 400.

In this embodiment that uses the local sense circuit 300 to sense both the upper memory as well as the lower memory, it is possible for the bit lines to be simultaneously used for both transferring data from the upper local sense circuit while the upper memory is being sensed. In such an embodiment, the bit lines should be shared between the two functions. The extra transistor circuit 400 of FIG. 4 can provide selective grounding of bit lines in order to implement the transfer of data from the local sense circuit to the global sense circuit during sensing of the upper memory.

Figure 5:
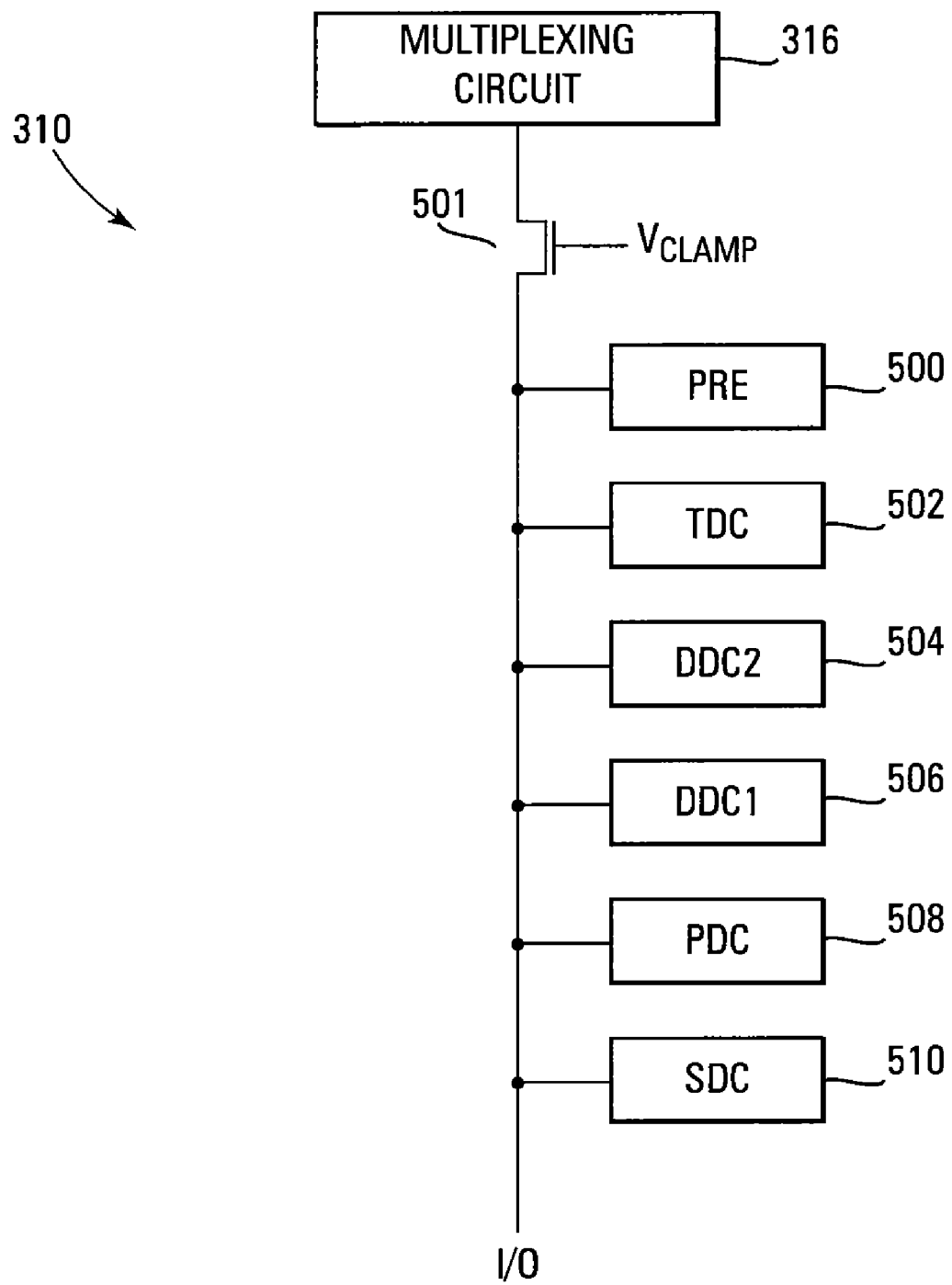
FIG. 5 shows a block diagram of one embodiment of a global sense circuit in accordance with the block diagram of FIG. 3.

FIG. 5 illustrates a block diagram of one embodiment of a global sense circuit 310 in accordance with the block diagram of FIG. 3. The global sense circuit 310 block diagram is for purposes of illustration only as alternate embodiments can use other functions/circuits in the global sense circuit 310.

The global sense circuit 310 comprises an access transistor 501 that connects the global sense circuit 310 to the lower multiplexing circuit 316. When the control signal $V_{CLAMP}$ is high, this transistor 501 is turned on and connected to the bit line that is selected by the multiplexing circuit 316. The NMOS access transistor 501 can be a PMOS transistor if inverse logic for the control signal $V_{CLAMP}$ is used.

The global sense circuit 310 further comprises a precharge circuit 500. When the multiplexing circuit 316 connects one of the odd or even bit lines to the global sense circuit 310, the precharge circuit 500 precharges that particular bit line prior to a sense operation.

A temporary data cache (TDC) 502 is used to temporarily store data during a program or sense operation. The data is stored in the TDC 502 before being moved to or after being moved from the primary data cache (PDC) 508, the secondary data cache (SDC) 510, dynamic data cache (DDC1) 506, or DDC2 504. If the present operation is a sense operation, the data in the TDC 502 is moved to the I/O line for use by external circuits such as a microprocessor that initiated the sense operation. If the present operation is a program operation, the data in the TDC 502 is moved to the selected memory cell during the portion of the operation in which the selected memory cell is programmed with the data.

The main data storage portion of the global sense circuit 310 comprises a DDC2 circuit 504, a DDC1 circuit 506, a PDC circuit 508, and a SDC circuit 510. The DDC1 and DDC2 circuits 506, 504 are used for controlling multi-level programming and storing multi-level data for selected memory cells in combination with the PDC circuit 508. In an SLC programming operation, if a logical '0' is being programmed to a selected memory cell, the bit line voltage for that cell is set to 0V by the PDC 508. If a logical '1' is to be programmed, the bit line voltage is set to $V_{CC}$ from the PDC 508. A logical '1' is an erased state and means no programming is to be done, thus the $V_{CC}$ on the bit line inhibits further programming of any cells coupled to that particular bit line.

FIG. 6 illustrates a block diagram of an alternate embodiment of a memory array having a local sense circuit. This embodiment divides up the memory bit lines into four separate local sections 610-613. This can further reduce the resistance and capacitance as compared to previously described embodiments that divide the bit line lengths in half.

The local sense circuits 602, 603 can also be used to sense different variations of the local bit lines 610-613. For example, one embodiment might use the upper local sense circuit 602 to sense the local bit lines A 610 and the local bit lines B 611 while the middle local sense circuit 603 senses local bit lines C 612. The global sense circuit 601 can then sense the lower local bit lines D 613. In another embodiment, the upper local sense circuit 602 can sense both the local bit lines A 610 and the local bit lines B 611 while the middle local sense circuit 603 senses both the local bit lines C 612 and the local bit lines D 613. The data from the sense operations can then be transferred to the global sense circuit 601 over the bit lines, as in previous embodiments, or over a global transfer line 605. The global sense circuit 601 can then store the transferred data in the appropriate data caches as previously discussed.

The global transfer line 605 is a single transfer line that is multiplexed between a certain number of local bit lines (e.g., 32 bit lines). For purposes of clarity, only a small number of local bit lines 604 of the local bit lines A group are multiplexed to a global transfer line 605. The other local bit lines B-D 611-613 could also have a certain number of their respective bit lines multiplexed to the global transfer line 605 for transfer to the global sense circuit 601. The quantity of global transfer lines needed to transfer data from the local bit lines 610-613 depends on the number of local bit lines multiplexed to each global transfer line.

In one embodiment, each local bit line can be sequentially coupled, through multiplexing circuits, to the global transfer line. Alternate embodiments can couple the local bit lines to their respective global transfer line to transfer data using some other sequencing scheme.

The transfer of data over the global transfer line 605, from one set of local bit lines to the global sense circuit, can be accomplished during a verify operation of other local bit lines. This can reduce the performance impact on sensing operations of other groups of local bit lines 610-613. In an alternate embodiment, the transfer of data might be accomplished at other times during a sense operation.

FIG. 7 illustrates a block diagram of yet another alternate embodiment of a memory array having multiple local sense circuits. This embodiment uses two local sense circuits 702, 703.

One of the local sense circuits 703 senses the upper local bit lines A 710. The other local sense circuit 702 senses the lower local bit lines B 711. Since the global sense circuit 701 does not perform any sensing function of the bit lines, it can be used for other sense operation functions such as data cache storage of transferred data and pre-charging of the bit lines.

The data transfer from the local bit lines A 710 and local bit lines B 711 can be accomplished over the global transfer line 700, where a certain number of local bit lines 702 are multiplexed to the global transfer line 700, or the data can be transferred over the bit lines to the global sense circuit 701. Alternate embodiments can also use combinations of these transfer schemes. For example, data from an upper group of local bit lines A 710 can be transferred to the global sense circuit over the global transfer line 700 while the lower local bit lines B 711 can transfer their data to the global sense circuit 701 over the bit lines.

Figure 8:
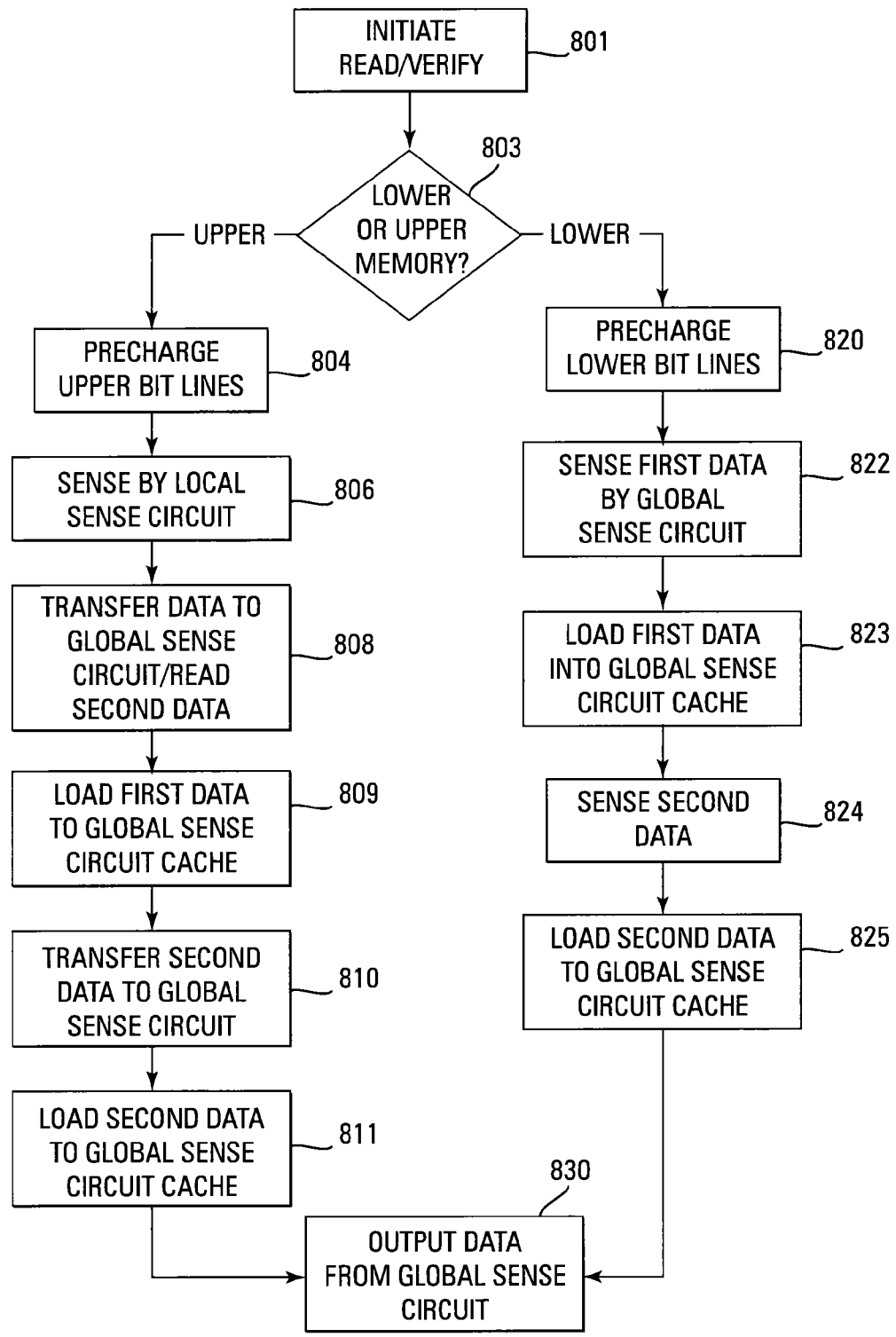
FIG. 8 shows a flowchart of one embodiment of a method for sensing with a local sense circuit.

FIG. 8 illustrates a flowchart of one embodiment of a method for sensing local bit lines in a memory device. This embodiment entails using the local sense circuit to sense the upper memory group while the global sense circuit senses the lower memory group. The method begins when a memory device control circuit initiates a read or program verify operation 801. It is then determined, from a physical memory address, whether an upper or lower memory group is to be sensed 803.

If the upper memory group is to be sensed, the upper bit lines are precharged 804 to a sense voltage by the precharge circuit in the local sense circuit. The local sense circuit then senses the bit lines of the upper memory group 806.

The local sensing 806 is performed by biasing the unselected word lines of the upper memory group at a voltage that turns on the word lines. The selected word line to be sensed is biased with a sense voltage that might be either a ramp voltage or a particular fixed voltage. For example, in an SLC memory, a fixed voltage might be used since the memory is one of either programmed to a certain threshold voltage or erased. In an MLC memory, the memory cell can be programmed to one of multiple threshold voltages and, thus, a ramp voltage (e.g., 0V to 4V) can be used to determine to which threshold voltage the memory cell is programmed.

If the bit line becomes discharged, the threshold voltage of the cell being sensed is less than the word line voltage. In this case, the cell is erased. If the bit line remains precharged, the threshold voltage(s) of the cell(s) being sensed is greater than the word line voltage that was applied to the word line being sensed. In this case, the memory cell is programmed. A programmed memory cell can be programmed with a logical 0, for an SLC device, or one of a select bit pattern of data (e.g., 00, 01, 10) for an MLC device. The charged/discharged states of the bit lines are sensed by the local sense circuit.

The precharge and discharge times are determined by the RC time constant of each bit line. The speed of the sense operation is thus determined by this RC time constant that can be reduced by using the local sense circuit as described previously.

After sensing memory cells of the first word line of the upper memory, an increased sense voltage is applied to memory cells of the first word line in order to sense second data. The first sensed data of each of the sensed upper memory cells are transferred by the local sense circuit to the global sense circuit 808 while each of the upper bit lines are discharged or held at a voltage based on the state of a respective sensed memory cell. The transfer of data can be accomplished over the bit lines or with a global transfer line.

The transferred, first sensed data are stored (e.g., loaded) into the cache of the global sense circuit 809. The second sensed data are transferred to the global sense circuit during the next discharge cycle 810 for sensing third data. The second data are loaded into the global sense circuit cache 811. The first and second sensed data are transferred out of the global sense circuit 830. The precharge/discharge and sense steps can be repeated to sense as many of the upper word lines as desired.

If the lower memory group is to be sensed, the lower bit lines are precharged 820 to a sense voltage by the precharge circuit in the global sense circuit. The global sense circuit then senses the bit lines of the lower memory group 822.

The sensing 822 is performed by biasing the word lines of the lower memory group, except the word line to be sensed, at a voltage that turns on the word lines. The word line to be sensed is biased with sense voltage as described previously.

If the bit line becomes discharged, the threshold voltage of the cell being sensed is less than the word line voltage. In this case, the cell is erased. If the bit line remains precharged, the threshold voltage(s) of the cell(s) being sensed is greater than the word line voltage that was applied to the selected word line being sensed. In this case, the memory cell is programmed. The charged/discharged states of the bit lines are sensed by the global sense circuit.

The first sensed states are stored in the global sense circuit cache 823 while the memory cells of the next word line to be sensed are biased with the sensed voltage or ramp voltage. The second states are then sensed by the global sense circuit 824 and stored in the global sense circuit cache 825. The first and second sensed data are output from the global sense circuit 830. These precharge/discharge and sense steps can be repeated to sense as many of the lower word lines as desired.

Figure 9:
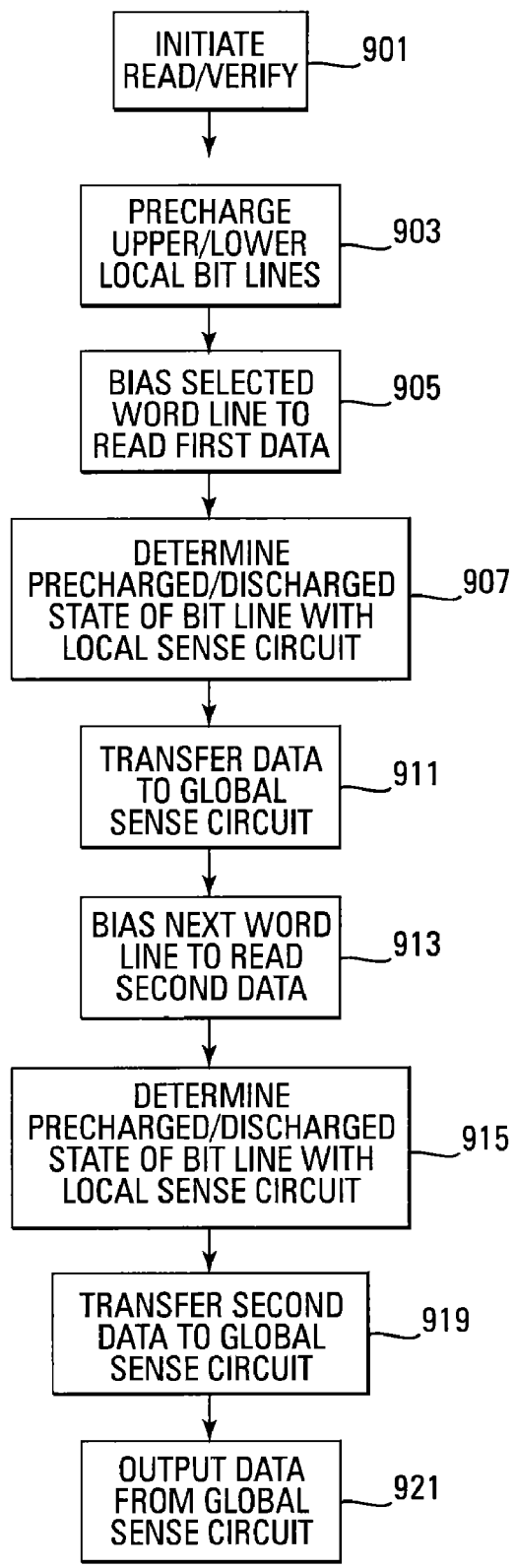
FIG. 9 shows a flowchart of another embodiment of a method for sensing with a local sense circuit.

FIG. 9 illustrates a flowchart of another embodiment of a method for sensing local bit lines in a memory device. This embodiment assumes that the local sense circuit senses both the upper and the lower memory groups and transfers the results to the global sense circuit that provides a cache function.

The method begins when a read or verify operation is initiated 901 by a memory controller. Both the lower and upper local bit lines are precharged to a sense voltage 903 by the precharge circuit in the local sense circuit.

The sensing is performed by biasing the unselected word lines of both the upper and lower memory groups at a voltage that turns on the word lines. The selected word line to be sensed is biased with either a sense voltage 905. For example, in an SLC memory, a read voltage might be used since the memory is one of either programmed to a certain threshold voltage or erased. In an MLC memory, the memory cell can be programmed to one of multiple threshold voltages and, thus, a ramp voltage (e.g., 0V to 4V) can be used to determine to which threshold voltage the memory cell is programmed.

If a selected bit line becomes discharged, the threshold voltage of the cell being sensed is less than the word line voltage. In this case, the cell is erased. If the bit line remains precharged, the threshold voltage(s) of the cell(s) being sensed is greater than the word line voltage that was applied to the word line being sensed. In this case, the memory cell is programmed. A memory cell can be programmed with a logical 0, for an SLC device, or one of a select bit pattern data (e.g., 00, 01, 10) for an MLC device. The charged/discharged states of the bit lines are sensed by the local sense circuit 907. If the selected bit line is a lower bit line and the bit line is discharged in response to its state, as previously described, the lower local bit line is discharged through the two additional transistors 400 provided in the local sense circuit, as shown in the embodiment of FIG. 4.

While the data from the first sense operation is being transferred to the global sense circuit for storage in the cache 911, a second selected word line to be sensed is biased with the sense voltage in order to sense second data 913. As in the first sense operation, the precharged/discharged state of the bit line, as sensed by the local sense circuit, is indicative of the data stored in the memory cell being sensed 915. The bottom local bit lines are again discharged, as determined by the state of the sensed memory cell, through the two additional transistors 400 provided in the local sense circuit of FIG. 4. Data are also transferred to the global sense circuit cache function 919 through the bit lines or a global transfer line.

As in previous embodiments, the transfer of data from the local sense circuit to the global sense circuit can be accomplished through the bit lines or a global transfer line. Such transfer operations have been discussed previously. The data stored in the global sense circuit cache function can then be output 921.

Figure 10:
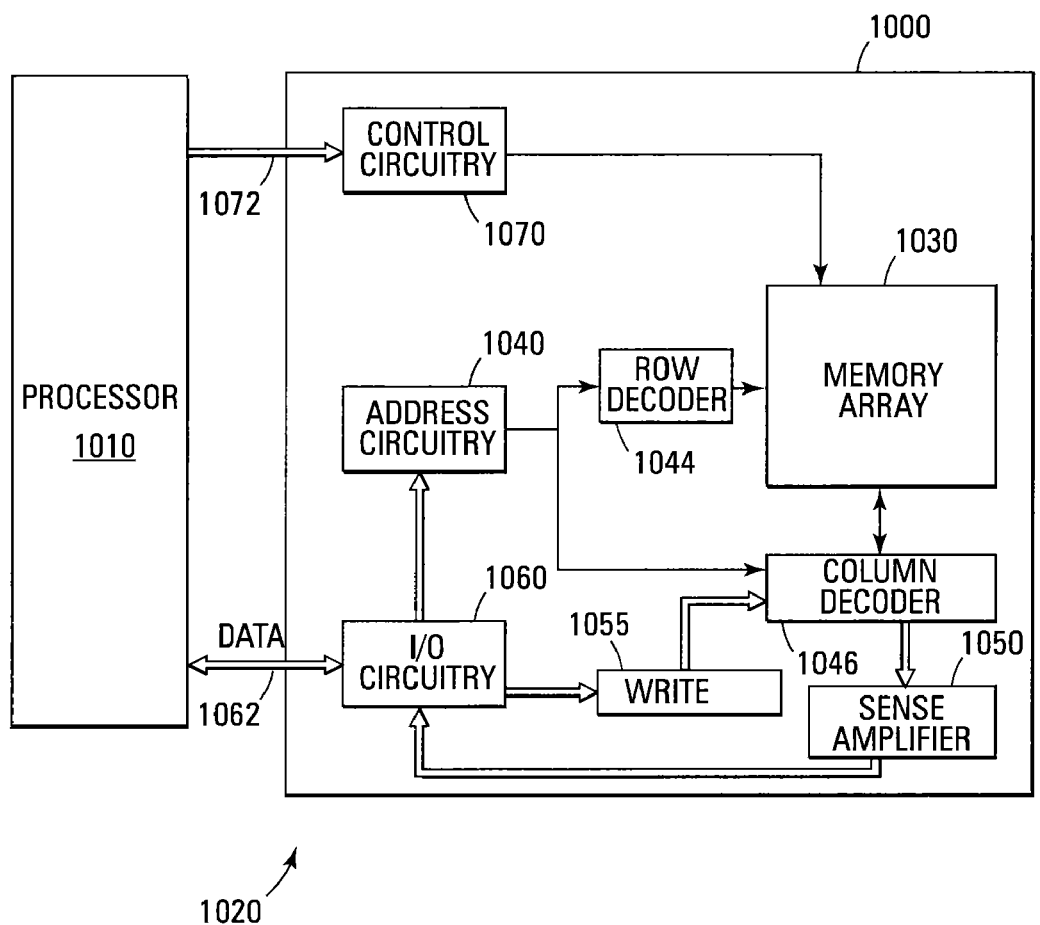
FIG. 10 shows a block diagram of one embodiment of a memory system that can incorporate the memory array with local sense circuits of the present embodiments.

FIG. 10 illustrates a functional block diagram of a memory device 1000. The memory device 1000 is coupled to an external processor 1010. The processor 1010 may be a microprocessor or some other type of controller. The memory device 1000 and the processor 1010 form part of a memory system 1020. The memory device 1000 has been simplified to focus on features of the memory that are helpful in understanding the present embodiments.

The memory device 1000 includes an array 1030 of non-volatile memory cells. The memory array 1030 is arranged in banks of word line rows and bit line columns. In one embodiment, the columns of the memory array 1030 comprise series strings of memory cells. As is well known in the art, the connections of the cells to the bit lines determines whether the array is a NAND architecture, an AND architecture, or a NOR architecture.

Address buffer circuitry 1040 is provided to latch address signals provided through I/O circuitry 1060. Address signals are received and decoded by a row decoder 1044 and a column decoder 1046 to access the memory array 1030. It will be appreciated by those skilled in the art, with the benefit of the present description, that the number of address input connections depends on the density and architecture of the memory array 1030. That is, the number of addresses increases with both increased memory cell counts and increased bank and block counts.

The memory device 1000 senses data in the memory array 1030 by sensing voltage or current changes in the memory array columns using sense amplifier circuitry 1050. The sense amplifier circuitry 1050, in one embodiment, is coupled to sense and latch a row of data from the memory array 1030. Data input and output buffer circuitry 1060 is included for bidirectional data communication as well as the address communication over a plurality of data connections 1062 with the controller 1010. Write circuitry 1055 is provided to write data to the memory array.

Memory control circuitry 1070 decodes signals provided on control connections 1072 from the processor 1010. These signals are used to control the operations on the memory array 1030, including data read, data write (program), and erase operations. The memory control circuitry 1070 may be a state machine, a sequencer, or some other type of controller to generate the memory control signals. In one embodiment, the memory control circuitry 1070 is configured to execute the embodiments of the local sensing method disclosed previously.

The flash memory device illustrated in FIG. 10 has been simplified to facilitate a basic understanding of the features of the memory. A more detailed understanding of internal circuitry and functions of flash memories are known to those skilled in the art.

CONCLUSION

In summary, one or more embodiments of the local sensing architectures and methods can provide reduced capacitance and resistance on bit lines in a memory array. The reduced capacitance/resistance can improve sensing performance by reducing the time to precharge and discharge bit lines during sensing.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory device comprising:
a memory array having a plurality of data lines;
a first sense circuit coupled to the plurality of data lines and configured to sense a first and a second group of memory cells of the memory array; and
a second sense circuit coupled to the plurality of data lines and configured to receive data transferred from the first sense circuit;
wherein the first or second circuits comprise:
a pair of inverters configured as a latch circuit;
a pair of transistors coupled to an output of the latch circuit as an output circuit;
first and second transistors coupled in series and further coupled to an input of the latch circuit;
a pull-up transistor coupled between the first and second transistor and coupled to a voltage source; and
a pair of series coupled transistors coupled between a ground potential and an input of the first or second sense circuits, a first transistor of the series coupled transistors having a gate coupled to an input of the latch circuit.

2. The memory device of claim 1 wherein the first sense circuit is configured to transfer the data to the second sense circuit over the data lines.

3. The memory device of claim 1 wherein the first sense circuit is configured to transfer the data to the second sense circuit over a global transfer line.

4. The memory device of claim 3 wherein the global transfer line is coupled to a certain number of the plurality of data lines through a multiplexing circuit such that the global transfer line has access to each of the certain number of the plurality of data lines.

5. The memory device of claim 4 wherein the multiplexing circuit is configured to provide the global transfer line with sequential access to each of the certain number of the plurality of data lines.

6. A memory device comprising:
a memory array having a plurality of data lines; and
a plurality of local sense circuits coupled to the plurality of data lines such that each local sense circuit is configured to sense only a certain group of memory cells coupled to the plurality of data lines and to transfer the sensed data to a global sense circuit wherein each of the plurality of local sense circuits comprise:
a pair of inverters configured as a latch circuit;
a pair of transistors coupled to an output of the latch circuit as an output circuit;
first and second transistors coupled in series and further coupled to an input of the latch circuit;
a pull-up transistor coupled between the first and second transistor and coupled to a voltage source; and
a pair of series coupled transistors coupled between a ground potential and an input of the first or second sense circuits, a first transistor of the series coupled transistors having a gate coupled to an input of the latch circuit.

7. The memory device of claim 6 wherein only the local sense circuits are configured to sense the certain groups of memory cells.

8. The memory device of claim 6 wherein the local sense circuits are configured to transfer the sensed data to the global sense circuit during a verify cycle.

9. The memory device of claim 6 wherein the global sense circuit is configured to sense a certain group of memory cells.

10. The memory device of claim 6 wherein the global sense circuit is configured to provide a precharge function and a dynamic data cache function to the plurality of data lines.

11. The memory device of claim 6 wherein the plurality of local sense circuits comprises a first local sense circuit that is configured to sense a first and a second group of memory cells and a second local sense circuit that is configured to sense a third and a fourth group of memory cells.

12. The memory device of claim 6 wherein the plurality of local sense circuits comprises a first local sense circuit that is configured to sense a first and a second group of memory cells and a second local sense circuit that is configured to sense a third group of memory cells, and further wherein the global sense circuit is configured to sense a fourth group of memory cells.

13. The memory device of claim 6 wherein the plurality of data lines comprise a plurality of local data lines for each different group of memory cells and each plurality of local data lines is coupled to a global transfer line, coupled to the global sense circuit, through a multiplexing circuit.

14. A method for local sensing of a memory device, the method comprising:
sensing data from a group of memory cells with a local sense circuit that comprises:
a pair of inverters configured as a latch circuit;
a pair of transistors coupled to an output of the latch circuit as an output circuit;
first and second transistors coupled in series and further coupled to an input of the latch circuit;
a pull-up transistor coupled between the first and second transistor and coupled to a voltage source; and
a pair of series coupled transistors coupled between a ground potential and an input of the first or second sense circuits, a first transistor of the series coupled transistors having a gate coupled to an input of the latch circuit;
transferring the sensed data from the local sense circuit to a global sense circuit; and
outputting the sensed data from the global sense circuit.

15. The method of claim 14 wherein the group comprises a first group and further comprising determining whether to sense the first group of memory cells or a second group of memory cells in response to an address.

16. The method of claim 15 and further comprising:
sensing data from the second group of memory cells with the global sense circuit;
storing the data from the second group of memory cells in the global sense circuit; and
outputting the stored data from the global sense circuit.

17. The method of claim 14 wherein the local sense circuit transfers the sensed data to the global sense circuit over data lines.

18. The method of claim 17 wherein the local sense circuit transfers the sensed data to the global sense circuit during a verify operation of a second group of memory cells.

19. The method of claim 14 wherein the local sense circuit transfers the sensed data to the global sense circuit over a global transfer line.

20. A method for local sensing of a memory device, the method comprising:
sensing data from first and second groups of memory cells with a local sense circuit that comprises:
a pair of inverters configured as a latch circuit;
a pair of transistors coupled to an output of the latch circuit as an output circuit;
first and second transistors coupled in series and further coupled to an input of the latch circuit;
a pull-up transistor coupled between the first and second transistor and coupled to a voltage source; and
a pair of series coupled transistors coupled between a ground potential and an input of the first or second sense circuits, a first transistor of the series coupled transistors having a gate coupled to an input of the latch circuit;
transferring the data to a global sense circuit for storage; and
outputting the data stored in the global sense circuit.

21. The method of claim 20 and further comprising the local sense circuit precharging first local data lines coupled to the first group of memory cells and second local data lines coupled to the second group.

22. The method of claim 21 wherein sensing data from the first and second groups of memory cells with the local sense circuit comprises the local sense circuit sensing a precharged or discharged state of the first and second local data lines.

23. The method of claim 20 wherein transferring the data comprises the local sense circuit transferring the data to the global sense circuit over a global transfer line.

24. The method of claim 23 wherein transferring the data to the global sense circuit comprises multiplexing the global transfer line to a plurality of upper local data lines such that each of the plurality of upper local data lines is sequentially coupled to the global transfer line.

25. The method of claim 20 wherein the second group of memory cells are precharged while the first group of memory cells are being sensed by the local sense circuit.

26. The method of claim 20 wherein a multiplexing circuit is disabled during a sense operation of the second group of memory cells.

\* \* \* \* \*